United States Patent [19]

Temple

[11] 4,305,084
[45] Dec. 8, 1981

[54] SEMICONDUCTOR SWITCHING DEVICE CAPABLE OF TURN-ON ONLY AT LOW APPLIED VOLTAGES USING SELF PINCH-OFF MEANS

[75] Inventor: Victor A. K. Temple, Clifton Park, N.Y.

[73] Assignee: General Electric Company, Schenectady, N.Y.

[21] Appl. No.: 168,606

[22] Filed: Jul. 14, 1980

Related U.S. Application Data

[63] Continuation of Ser. No. 94,942, Nov. 16, 1979, abandoned.

[51] Int. Cl.³ .................................. H01L 29/74
[52] U.S. Cl. .............................. 357/38; 357/20; 357/22; 357/56; 357/86
[58] Field of Search ............... 357/20, 22, 38, 56, 357/86

[56] References Cited

U.S. PATENT DOCUMENTS

| 3,489,962 | 1/1970 | McIntyre et al. | 357/38 |
| 3,671,821 | 6/1972 | Nakata et al. | 357/38 |
| 4,012,761 | 3/1977 | Ferro et al. | 357/38 |

OTHER PUBLICATIONS

G. King, "Solid-State Relays," Electromechanical Design, Oct., 1974, pp. 14–23.

Primary Examiner—Joseph E. Clawson, Jr.
Attorney, Agent, or Firm—Marvin Snyder; James C. Davis, Jr.

[57] ABSTRACT

A semiconductor device which can be turned on at voltage signals applied thereto below a selected voltage magnitude includes a pinch-off region of semiconductor material having a precisely controlled net dopant charge situated in the gate current path of the semiconductor device such that the normal gate current path of the device is pinched-off when the voltage applied to the device equals or exceeds the selected magnitude.

13 Claims, 3 Drawing Figures

SEMICONDUCTOR SWITCHING DEVICE CAPABLE OF TURN-ON ONLY AT LOW APPLIED VOLTAGES USING SELF PINCH-OFF MEANS

This is a continuation of application Ser. No. 94,942, filed Nov. 16, 1979, now abandoned.

BACKGROUND OF THE INVENTION

This invention relates to semiconductor switching devices, and more particularly to semiconductor switching devices which minimize voltage transients during device switching.

DESCRIPTION OF THE PRIOR ART

Thyristors, triacs and transistors are semiconductor devices often used to turn on and turn off alternating currents. These devices include at least first and second main current carrying electrodes and a control electrode or gate. A main voltage is applied across the first and second electrodes such that a main current flows therebetween upon application of a control signal to the control electrode. The device is said to be in a turned-on state when the main current flows between the first and second electrodes. Typically, when such semiconductor devices are switched from a turned-off state to a turned-on state by application of an appropriate gating control signal thereto, a relatively large switching transient occurs if the gating signal is provided to the device during a portion of the alternating voltage cycle when the alternating main voltage applied to the device exhibits a relatively high magnitude. This rapid reduction in device voltage results in undesirable noise being generated in any system in which the device is included as a component. However, this undesirable transient is of significantly smaller magnitude if a gating signal is applied to the device earlier in the duty cycle at a point in time when the alternating main voltage supplied to the device is of smaller magnitude.

The present invention concerns a semiconductor switching device which avoids or substantially reduces the generation of undesirable switching transients by firing only if the gate signal arrives at a voltage which is below a predetermined level. As a result, undesirable noise during device switching is eliminated or substantially attenuated.

One object of the invention is to eliminate or substantially reduce the magnitude of switching transients in semiconductor switching devices.

Another object of the invention is to provide a semiconductor switching device capable of being turned on only when voltage applied to the main current carrying terminals of the device is less than a selected low voltage.

These and other objects of the invention will become apparent to those skilled in the art upon consideration of the following description of the invention.

BRIEF SUMMARY OF THE INVENTION

The present invention is directed to eliminating or substantially reducing the amplitude of switching transients in semiconductor switching devices. In accordance with one preferred embodiment of the invention, a semiconductor switching device includes at least first, second and third regions of semiconductor material of alternating conductivity types. The second region overlies the first region and the third region overlies a substantial portion of the second region, thus forming a first PN junction between the first and second regions and a second PN junction between the second and third regions. A portion of the second region forms a portion of the top surface of the semiconductor material and is designated as the upper gate surface. The remainder of the top surface of the semiconductor material is formed by the third region. A control current electrode metallization is situated on a portion of the upper gate surface for electrical connection purposes. The second region includes a lower gate surface disposed opposite the upper gate surface. A current supplied to the gate metallization flows along a path extending from the upper gate surface through the second region to the third region and causes the device to be turned on, thus permitting a main current to flow between the first and third regions upon application of a voltage of appropriate predetermined magnitude therebetween. The device includes a controlled pinch-off region, having a selected geometric pattern, situated in the second region surrounding the portion of the second region beneath the gate metallization, and extends from the upper gate surface to the lower gate surface within the gate current path. The controlled pinch-off region is provided with a selected charge concentration per unit area such that it exhibits a high admittance when the voltage between the first and third regions is below a selected value and exhibits a low admittance when this voltage increases to at least the selected value. The device includes resistance means operatively coupled between the gate metallization and the third region, which preferably exhibits an admittance less than that exhibited by the pinch-off region when the predetermined voltage is below the selected value. The invention may be practiced in the form of thyristors, triacs, transistors and other semiconductor switching devices to substantially reduce switching transients therein. The thyristor embodiment of the invention includes a fourth region of semiconductor material underlying the first region and having a conductivity type opposite that of the first region.

The features of the invention believed to be novel are set forth with particularity in the appended claims. The invention, itself, however, both as to organization and method of operation, together with further objects and advantages thereof, may best be understood by reference to the following description taken in conjunction with the accompanying drawings.

DESCRIPTION OF THE DRAWINGS

FIG. 1b is a top view of the semiconductor device shown in FIG. 1a; and

DETAILED DESCRIPTION OF THE PREFERRED EMBODIMENT

Figure 1A:
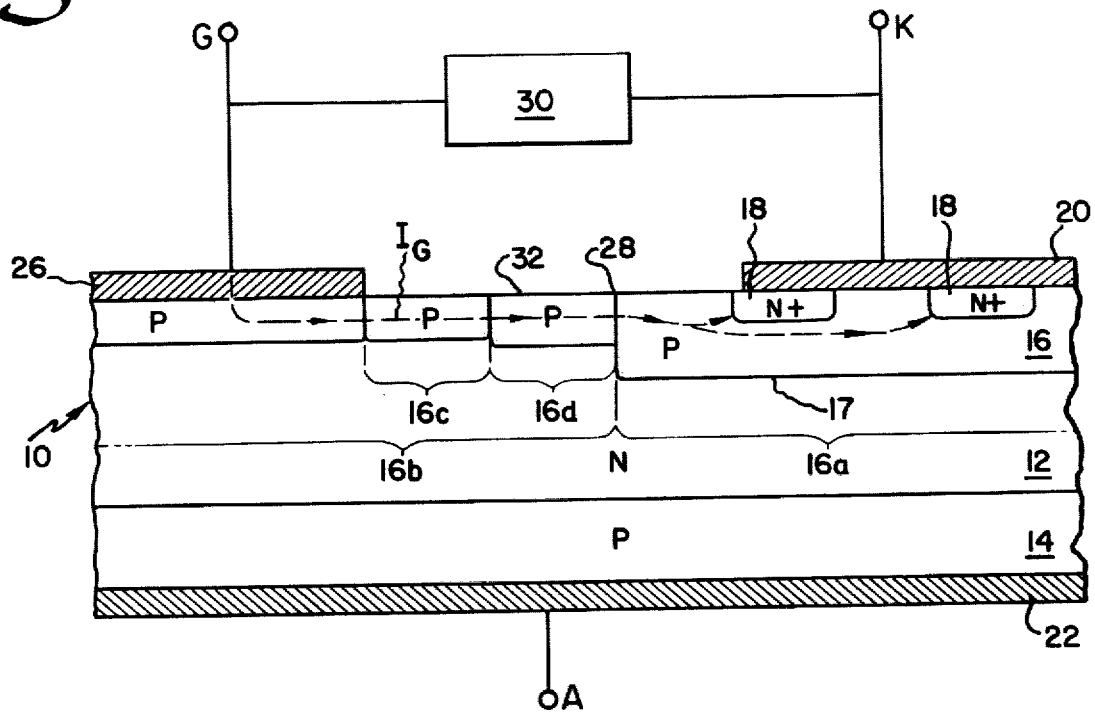
FIG. 1a is a cross section of one preferred embodiment of the semiconductor switching device of the present invention.
Figure 1B:
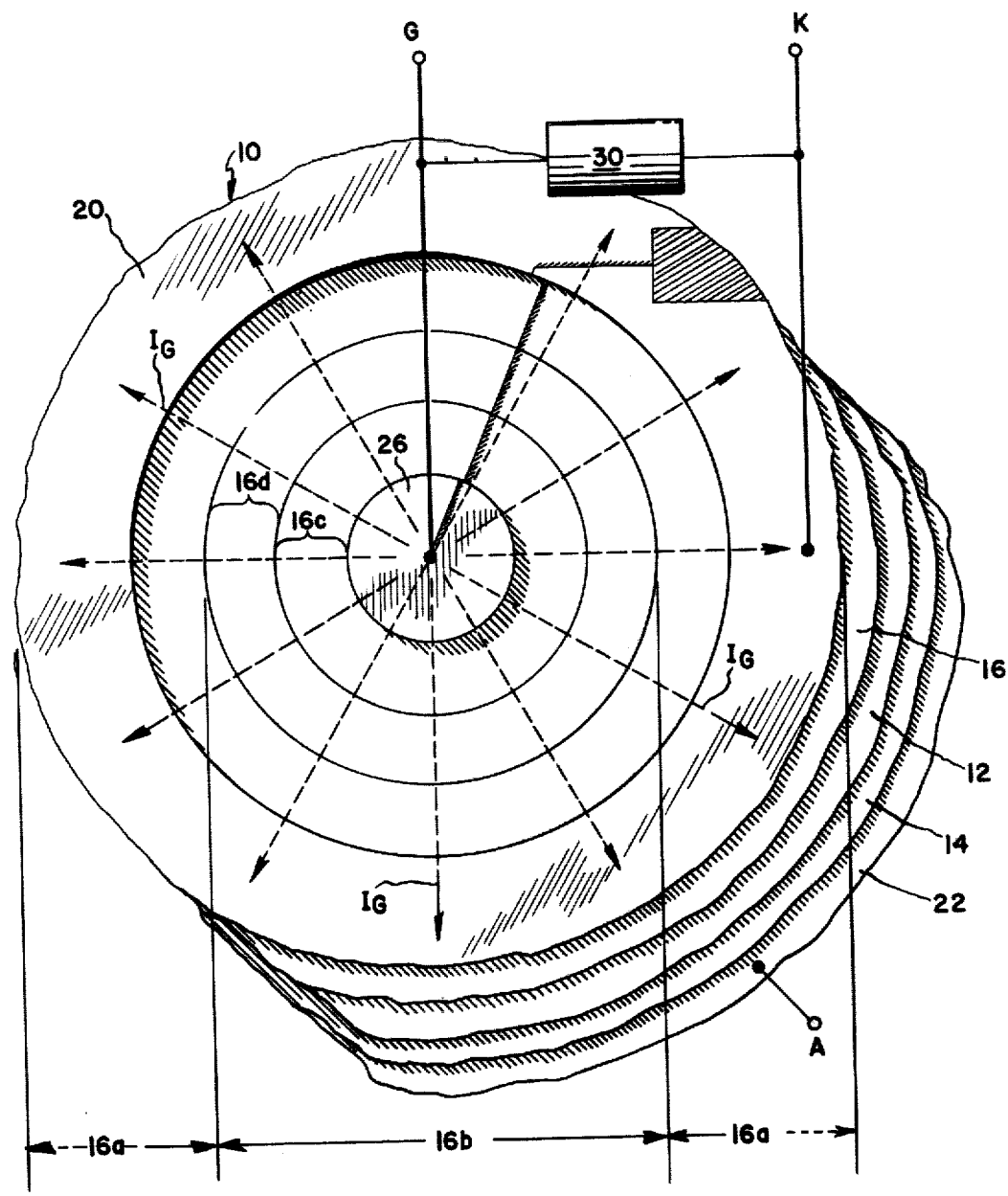

FIG. 1a shows a portion of a semiconductor switching device 10 in a thyristor configuration for exemplary purposes. Device 10 includes an anode base region 12 of N type semiconductor material. An anode region 14 of P type semiconductor material is situated beneath and in contact with region 12. A cathode-base region 16 of P type semiconductor material is situated above and in contact with region 12. Semiconductor region 16 forms a major portion of the top surface 32 of semiconductor device 10. Semiconductor region 14 forms the substrate of device 10. Region 16 includes a plurality of subregions, namely, primary cathode base region 16a, gate region 16b, pinch-off region 16c and in some embodiments, a junction termination extension region 16d, all as shown in FIG. 1. Primary cathode-base region 16a is conveniently annularly shaped, as evident from FIG. 1b. Region 16a is typically diffused in, or otherwise formed above, a substantial portion of semiconductor region 12 according to deposition and semiconductor crystal growth techniques well known to those skilled in the art. A plurality of emitting regions 18 of N+ type semiconductor material are diffused in region 16 or otherwise formed to extend from surface 32 into primary base region 16a. A metallization layer 20 is applied atop emitter regions 18 to electrically connect the regions to each other and to primary base region 16a. Emitters 18 are thus electrically shorted to cathode base region 16 to assure that device 10 exhibits desirable dv/dt characteristics. Metallization layer 20 provides the cathode connection K to device 10. A metallization layer 22 is situated in contact with region 14 to form the bottom surface of device 10 and the electrical connection A to anode region 14. Respective PN junctions exist between regions 12 and 14, regions 12 and 16 and regions 16 and 18.

A gate region 16b of P type semiconductor material, situated above and in contact with the portion of semiconductor region 12, comprises all of region 16 except primary base region 16a. A gate metallization layer 26 overlies a portion of gate region 16b to provide an electrical connection G to region 16. The depth of gate region 16b is generally, although not necessarily, less than the depth of primary base region 16a as measured from top surface 32 of the semiconductor material. Gate region 16b abuts primary base region 16a and thus is electrically connected thereto.

A pinch-off region 16c of semiconductor material exhibiting a selected dopant quantity $Q_p$ is situated in gate region 16b surrounding the portion of region 16b contacted by gate metallization 26. Region 16c is conveniently annularly shaped as shown in FIG. 1b. To enhance the high voltage characteristics of semiconductor device 10, junction termination extension region 16d comprised of Ptype semiconductor material of selected dopant charge $Q_J$ is included in gate region 16b surrounding and contacting pinch-off region 16c. Junction termination extension region 16d is conveniently annularly shaped and typically joins pinch-off region 16c. This junction termination extension region as employed to increase device high voltage characteristics is described and claimed in my copending U.S. patent application Ser. No. 913,026, filed June 6, 1978 and assigned to the instant assignee, the disclosure thereof being incorporated herein by reference. The value of $Q_p$ is selected such that region 16c exhibits a moderate to high admittance at zero volts, compared to the admittance circuit element 30. This admittance is reduced as the device voltage increases and becomes zero at the preselected pinch-off which may typically be 20 volts. Thus, below the pinch-off voltage of region 16c, when an appropriate gate signal is applied to gate contact 26, a gate current $I_G$ flows from gate contact 26 through the portion of gate region 16b therebelow, through the now zero admittance of pinch-off region 16c which offers relatively little impedance to such gate current flow, and through junction termination extension region 16d through primary base region 16a to emitters (or cathodes) 18. Flow of such gate current $I_G$ switches semiconductor device 10 to an on state, that is, it creates a high admittance path between anode region 14 and cathode region 18, permitting a substantial main current to flow therebetween. Once the device is turned on, the gate loses control over firing of the device in this thyristor example.

The value of $Q_p$ is selected such that pinch-off region 16c exhibits a relatively low admittance to gate current flow when the voltage applied between anode region 14 and cathode regions 18 equals or exceeds a selected magnitude. Thus, for example, if a sinusoidal signal or other type of alternating current waveform is applied to device 10 between the anode and cathode thereof, device 10 is triggered to an on state if it is supplied with an appropriate gating signal during the portion of the duty cycle of the alternating voltage during which its amplitude is positive and less than the selected magnitude. However, if a gating signal is supplied to gate 16 during the portion of the duty cycle in which the magnitude of the device voltage equals or exceeds this selected value, device 10 will nevertheless remain in an off state substantially incapable of being triggered on until the applied anode to cathode voltage is diminished to a magnitude less than the selected magnitude. When the amplitude of the voltage applied between the cathode and anode of device 10 equals or exceeds this selected value, region 16c becomes pinched off, thus presenting a low admittance, that is, high impedance, to gate current flow and preventing device 10 from being turned on. The selected anode-cathode voltage value at and above which pinch-off region 16 becomes pinched off is designated the pinch-off voltage, $V_p$.

To achieve the above described switching characteristics, $Q_p$ of pinch-off region 16c is selected in devices with a constant doped N base according to the following equation:

$$Q_p = \sqrt{2\epsilon N_d q V_p} \qquad \text{(equation 1)}$$

wherein
$\epsilon$ = semiconductor dielectric constant.
$N_d$ = doping concentration of the anode base region
q = electron charge
$V_p$ = the pinch-off voltage.
Equation (1) can be generalized to $$Q_p = \int_0^{W(V_N)} N_d(X) q \, d \qquad \text{(equation 2)}$$

where $W(V_N)$ is the depletion width of the anode base at the pinch-off voltage and $V_p = V_N + V_P$ is the sum of the voltages on N and P sides of the junction, respectively. Under these conditions, the admittance Y of region 16c is relatively high and is governed by the following equation:

$$Y = Y_o(1 - Q/Q_p) \qquad \text{(equation 3)}$$

where $Y_o$ is the admittance of region 16c at zero volts and Q is the ionized charge in the pinch-off region at voltage V for an applied anode to cathode voltage less than the pinch-off voltage $V_p$. For applied voltages equal to or greater than $V_p$ and with values of $Q_p$ selected for pinch-off region 16c according to equation (1), the admittance of pinch-off region 16c is essentially zero or some relatively small value. Thus, gate current $I_G$ is essentially prevented from flowing through device 10 and device 10 remains in an off state when a gate signal is applied thereto during the portion of an alternating current duty cycle in which the voltage applied between anode 14 and cathode 18 equals or exceeds the pinch-off voltage $V_p$.

A conductor 30 having a selected admittance Y is conveniently situated on or in semiconductor device 10 and connects gate metallization 26 to cathode metallization 20. Conductor 30 typically comprises an external discrete resistor or a resistor formed on the upper surface of device 10 by known thick film or thin film techniques, for example. The admittance $Y_c$ of conductor 30 is selected according to the equation $$Y_c = fY_o \quad \text{(equation 4)}$$

wherein f may vary from 0.01 to as much as 10. For low f values, transfer of gate current to conductor 30 occurs sharply at $V_p$. For high values of f, much gate current is wasted even at low voltages. Therefore, a value of f at 0.1 to 0.5 is preferred in most applications.

As the pinch-off voltage $V_p$ is approached when a voltage signal whose amplitude increases with time is applied between the anode and cathode terminals of semiconductor device 10, an increasingly greater amount of the gate current $I_G$ is diverted to conductor 30 away from the gate current path previously described until, at and beyond the pinch-off voltage, substantially all gate current flows through the external path provided by conductor 30. When this occurs, semiconductor device 10 desirably can no longer be fired, that is, turned on by application of a control voltage to gate region 16b.

Semiconductor device 10 is conveniently formed by techniques such as diffusion, epitaxial crystal growth, deposition, etching and ion implantation, all of which are techniques known to those skilled in the art. More specifically, semiconductor device 10 is typically fabricated from a silicon wafer of N-type semiconductor material comprising region 12 and having opposed major surfaces. A region of P-type semiconductor material is diffused into one of the opposed surfaces of silicon wafer 12 to form region 14 and a PN junction 17 therebetween. Metallic material layer 22 comprised of an electrically conductive metal, aluminum for example, is deposited on region 14 to achieve electrical connection thereto. Region 12 typically exhibits a low dopant concentration, for example $10^{14}$/cc in a 1000 volt device. Region 14 has a high dopant concentration. Region 16a of P-type semiconductor material also having a high dopant concentration. Both regions 12 and 14 may typically be diffused into a portion of the remaining opposed surface of silicon wafer 12. Emitter regions 18 of N+ type semiconductor material having a dopant concentration higher than that of region 16 may typically be diffused into semiconductor region 16a. Electrically conductive layer 20 comprised of a metal, such as aluminum for example, is deposited on emitter regions 18 to connect regions 18 and the portion of semiconductor region 16a situated therebetween together. Semiconductor region 16b of P type semiconductor material has a controlled net dopant dose. Regions 16a and 16b join at junction termination extension region 16d boundary 28. Gate metallization layer 26 of electrically conductive material is deposited on a portion of semiconductor region 16b as previously mentioned. Pinch-off region 16c is formed in region 16b surrounding the portion of region 16b beneath gate metallization 26. In order for device 10 to be capable of turn-on during gating while the voltage supplied between anode region 14 and cathode-emitter regions 18 is less than $V_p$ the dopant charge concentration of the pinch-off region 16c must closely approximate the $Q_p$ calculated according to equation (1) at the desired selected pinch-off voltage $V_p$. Pinch-off region 16c is preferably formed by completely etching away the portion of region 16b at which pinch-off region 16c is to be situated. The etched region thus formed is subjected to ion implantation of semiconductor material particles of P conductivity type. With this ion implantation, the implanted dopant charge concentration is advantageously precisely controlled such that $Q_p$ in pinch-off region 16c is precisely controlled as is necessary to achieve pinch-off at the desired selected voltage $V_p$ applied between the anode and cathode of device 10. For example, to achieve pinch-off voltage of 20 volts, with $N_d = 10^{14}$, a dopant concentration $Q_p$q equal to $1.58 \times 10^{11}$ donors/cm² is implanted via implantation and fully activated in pinch-off region 16c. Such ion implantation results in high local charge concentrations in pinch-off region 16c and thus relatively low average mobility. To increase the average mobility in pinch-off region 16c, device 10 is subjected to an elevated temperature, typically above 900° C. to activate and partially drive-in implanted region 16c. This activation removes crystallographic defects caused by dopant particles impinging on the silicon crystal lattice of semiconductor device 10 in the course of ion implantation. The drive-in results in a more uniform distribution of dopant charge in pinch-off region 16c in a manner that allows the implanted atoms to act as acceptors (or donors).

Alternatively, pinch-off region 16c is formed using conventional photolithographic-etching techniques to etch away a sufficient amount of P type semiconductor material or region 16b to leave a region 16c of desired dopant charge concentration $Q_p$ remaining.

Figure 2:
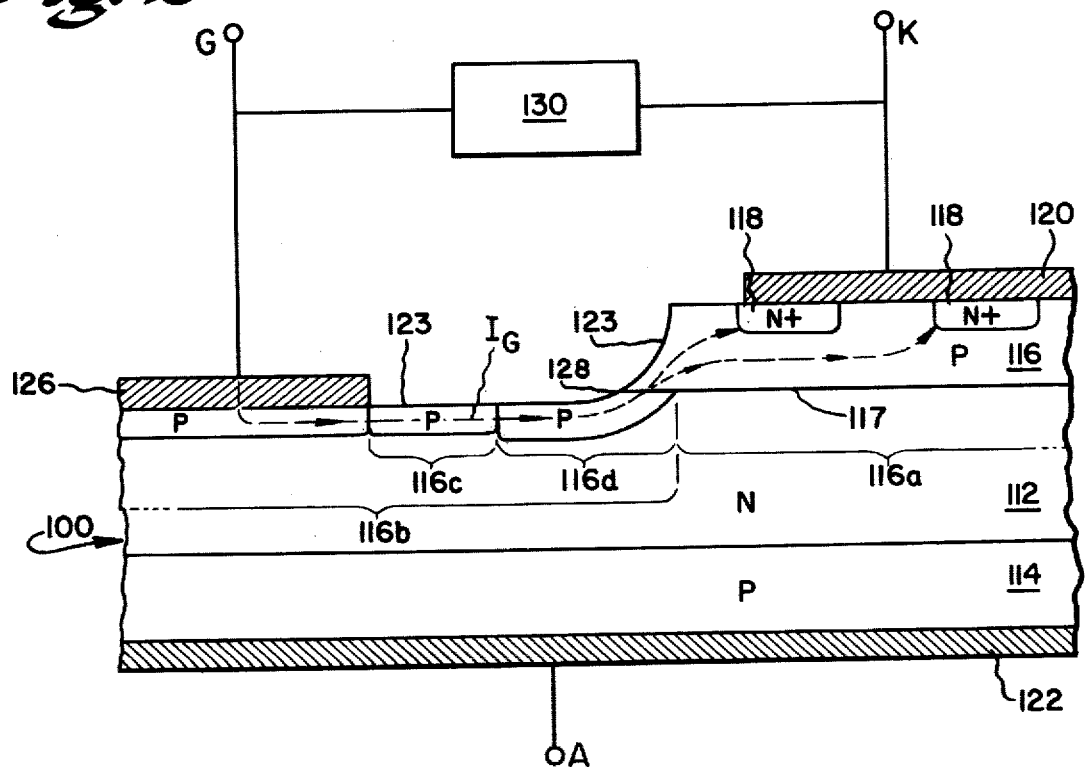
FIG. 2 is a cross section of another embodiment of the semiconductor switching device of the present invention.

FIG. 2 shows another preferred embodiment 100 of the semiconductor switching device of the invention. Device 100 is a thyristor including a layer of N type semiconductor material 112 having first and second major opposed surfaces. A substrate layer of P type semiconductor material 114 in contact with one of the major surfaces of region 112 forms the anode region of device 100. A metallization layer 122 typically comprised of aluminum or other electrically conductive metal is disposed on region 114 as anode contact A to achieve electrical connection to the anode. A layer of P type semiconductor material 116 is situated above and in contact with region 112 to form the cathode-base region of device 100. A recessed portion 123 is formed in a portion of semiconductor region 116 typically by completely etching away a portion of region 116 so as to leave a portion of N type region 112 exposed and partially etched. The unrecessed portion 116a of region 116 remains after formation of recessed portion 123. A region of P type semiconductor material 116b is situated in semiconductor device 100 beneath recessed portion 123 and abuts region 116a so as to achieve electrical connection thereto. Region 116b is a gate region, typically formed by diffusion of P type dopant impurities into region 112 at recessed portion 123. A metallization layer 126 of electrically conductive material such as aluminum, for example, is situated above and in contact with a portion of gate region 116b to achieve electrical connection G to the gate region. Gate region 116b includes a pinch-off region 116c of P type semiconductor material situated surrounding the portion of region 116b immediately below gate metallization layer 126. Pinch-off region 116c is conveniently annularly shaped and formed in the same manner as pinch-off region 16c described above in the discussion of FIG. 1. The dopant charge concentration $Q_P$ of pinch-off region 116c is governed by equation 1.

A junction termination extension region 116d of P type semiconductor material is conveniently situated in the portion of gate region 116b remaining after pinch-off region 116c is situated therein as described above. A junction termination 128 is formed where junction-extension region 116d joins region 116. Junction-extension region 116d surrounds and contacts pinch-off region 116c and extends laterally from the portion of region 116 in the proximity of junction termination 128 to pinch-off region 116c. Junction extension region 116d advantageously increases the avalanche breakdown voltage of the PN junction formed between semiconductor regions 116 and 112.

A plurality N+ type semiconductor regions 118 are situated in region 116 extending from the top surface thereof into region 116 to form the emitters or cathodes 118 of device 100. A metallization layer of electrically conductive material, such as aluminum, is situated above and in contact with emitters 118. Metallization layer 120 contacts the portion of P type semiconductor region 116 between emitters 118 and forms the cathode connection K to device 100. A conductor 130 exhibiting a selected admittance $Y_c$ is coupled between gate metallization layer 126 and cathode metallization layer 120, thus providing a current path between gate region 116b and cathode 118. The value of admittance $Y_c$ of conductor 130 is selected as previously described in selecting the admittance of conductor 30 already described in conjunction with FIG. 1.

As mentioned, the invention may include junction termination extension region 16d in device 10 and region 116d in device 100 in addition to the pinch-off regions 16c and 116c, respectively, to increase the avalanche breakdown voltage of semiconductor devices fabricated in accordance with the invention. Junction termination extension regions 16d and 116d increase the breakdown voltage of PN junctions 17 and 117, respectively. These junction termination extension regions have the same semiconductor conductivity type as that of the gate regions of the devices in which the junction termination extension regions are employed. Thus, in semiconductor devices 10 and 100, junction termination extension regions 16d and 116d are comprised of P type semiconductor material. These junction termination extension regions directly underlie the top surface of the device, a major portion of the junction termination extension region being situated between the pinch-off region and the junction termination (28 or 128, for example) of the PN junction (17 or 117, for example) for which a high breakdown voltage is desired. These junction termination extension regions have a greater lateral extent than thickness (as measured from the top surface of the device) and are oriented approximately parallel to the major plane of such PN junction. If desired, junction extension regions 16d and 116d may overlap a portion of primary gate regions 16a and 116a, respectively.

The junction termination extension region functions to reduce the peak bulk and peak surface electric fields of a semiconductor device and to increase the avalanche breakdown voltage of a selected PN junction therein to near its ideal value. The manner in which this is achieved is completely discussed in my above-cited copending patent application Ser. No. 913,026, filed June 6, 1978. However, to briefly describe how the junction termination extension region achieves these desirable results, it is necessary to define an ideal PN junction as that junction formed between two parallel layers of semiconductor material in contact with each other, the length of such layers extending to infinity. In this ideal case, there are no surface effects to be accounted for $V_{id}$ is defined as the avalanche breakdown voltage of this ideal junction. The breakdown voltage of PN junctions in actually physically realizable semiconductor devices is generally substantially smaller than $V_{id}$.

When the ideal PN junction is reverse biased, a depletion region is formed around the junction. $Q_{id}$ is defined as the ideal charge per unit area present in the depletion region on either side of this ideal junction when $V_{id}$ is applied to the junction. $W_{id}$ is defined as the depletion width of the lightly doped side of the junction under the above-described ideal conditions. $W_{JTER}$ is defined as the length of the junction termination extension region, that is, the distance along its lateral extent parallel to the major plane of the PN junction.

When a junction termination extension region, such as regions 16d and 116d, is provided in an actual semiconductor device containing at least one PN junction, the avalanche breakdown voltage of this junction approaches $V_{id}$. It has been found that careful control of $Q_{JTER}$, the charge concentration per unit area present within the junction termination extension region measured when depleted, together with careful control of its lateral extent, $W_{JTER}$, not only allows for creation of a device with a pN junction of breakdown voltage approaching $V_{id}$, the ideal case, but also by proper selection of $Q_{JTER}$, peak bulk and peak surface electric fields of the deivce are reduced to optimal values.

Lower values of $Q_{JTER}$ desirably result in higher PN junction breakdown voltages and in lower values of peak surface electric fields. However, lower values of $Q_{JTER}$ result in higher peak bulk electric fields in the junction region. Best results are achieved when $Q_{JTER}$ is within the range of 0.6 to 0.9 $Q_{id}$ although values of $Q_{JTER}$ as low as 0.2 $Q_{id}$ will still produce some improvement of device characteristics. Values of $Q_{JTER}$ as high as approximately 1.5 $Q_{id}$ will yield improved device performance. For $Q_{JTER}$ values within this preferred range, the breakdown voltage of the junction approaches $V_{id}$ and further, both the surface and bulk electric fields are reduced as compared to a PN junction without a junction termination extension region.

The width of the junction termination extension region $W_{JTER}$ is another important, although less critical, parameter which must be controlled in order to achieve the most effective peak surface field reduction and increase of device breakdown voltage. It has been found that $W_{JTER}$ should be approximately equal to, or greater than, one half $W_{id}$. Values of $W_{JTER}$ less than one half $W_{id}$ will still allow the device to function although performance will be degraded as $W_{JTER}$ becomes smaller, that is, the breakdown voltage of the PN junction provided with the junction termination extension region will not be as high as it would for higher values of $W_{JTER}$. $W_{JTER}$ may be greater than one half $W_{id}$, but values in excess of 2 $W_{id}$ do not result in significant improvement of device performance beyond that achieved with somewhat smaller values of $W_{JTER}$. $W_{JTER}$ values in excess of 2 $W_{id}$ tend to result in devices with an unnecessarily large surface area, although they function well.

In order for the junction termination extension region to function effectively in increasing device avalanche breakdown voltage, a portion of the junction termination extension region should be situated within a distance of approximately one-fourth $W_{id}$ or less from the junction termination (28 or 128). The distance between the junction termination extension region and the junction termination may exceed one fourth $W_{id}$ and the device will still function; however, device performance in terms of increased breakdown voltage becomes increasingly degraded the more this distance exceeds one-fourth $W_{id}$. For preferred embodiments of the invention in which the junction termination extension region overlaps into the primary cathode base regions of the device such as regions 16a and 116a, the portion of the junction extension region situated within the gate regions, such as 16b and 116b, must have a length approximately equal to or greater than one-half $W_{id}$. The junction termination extension region is conveniently formed by ion implantation and subsequent activation in a manner similar to that used in forming pinch-off regions 16c and 116c.

The pinch-off region described above may be employed in other semiconductor devices besides thyristors, such as switching transistors and triacs, to prevent device firing at voltages greater than a selected relatively low voltage. In such devices, the pinch-off region prepared as described above, is simply situated in the path of the gating control current which turns on the device. That is, for switching transistors the pinch-off region is situated in the base current path and is formed according to the above teachings. In the triac embodiment, two thyristors, each formed as described and including a respective pinch-off region are connected in anti-parallel configuration.

The foregoing describes a semiconductor switching device including a specially prepared pinch-off region to substantially reduce switching transients and achieve a predictable turn-on voltage window below a selected low value of applied main voltage.

While only certain preferred features of the invention have been shown by way of illustration, many modifications and changes will occur to those skilled in the art. It is, therefore, to be understood that the present claims are intended to cover all such modifications and changes as fall within the true spirit of the invention.

What is claimed is:

1. a semiconductor switching device for switching on a main current developed by an applied voltage supplied to said device only when said voltage is below a predetermined magnitude, comprising:

first, second and third regions of semiconductor material of alternating conductivity types, said second region overlying said first region, said third region overlying a substantial portion of said second region, and a conductive layer overlying a portion of the remainder of said second region, said second region providing a control current path therein between said conductive layer and said third region;

a conductor of predetermined admittance coupled between said second and third regions; and a controlled pinch-off region situated in the current path of said second region and substantially surrounding the portion of said second region beneath said conductive layer, said pinch-off region exhibiting a charge concentration per unit area selected such that said pinch-off region exhibits high average admittance relative to that of said conductor, said applied voltage supplied to said semiconductor device being between zero and a selected value and said pinch-off region exhibiting a low admittance relative to said conductor when said applied voltage is at least equal to said selected value.

2. The semiconductor device of claim 1 wherein said pinch-off region is of annular configuration about the portion of said second region beneath said conductive layer.

3. The semiconductor device of claim 1 wherein said device comprises a thyristor including a fourth region of semiconductor material underlying said first region and exhibiting conductivity type opposite that of said first region, said fourth region constituting an anode, said second region constituting a gate, and said first region constituting an anode-base.

4. The semiconductor device of claim 1 wherein said second region includes a junction termination extension region adjoining said pinch-off region, said junction termination extension region being comprised of semiconductor material of the same conductivity type as said pinch-off region and exhibiting a selected dopant charge concentration per unit area, when fully depleted, within the range of 0.2 $Q_{id}$ to 1.5 $Q_{id}$, $Q_{id}$ being the amount of charge per unit area present in the depletion region of an ideal junction when the avalanche breakdown voltage of said ideal junction is applied to said ideal junction.

5. The semiconductor device of claim 4 wherein said second region of semiconductor material includes a primary cathode-base region beneath said third region, said junction termination extension region being joined with said primary cathode-base region.

6. The semiconductor device of claim 4 wherein said junction termination extension region surrounds said pinch-off region.

7. The semiconductor device of claim 5 wherein the depth of said primary cathode-base region overlaps the depth of said pinch-off region in said device.

8. The semiconductor device of claim 5 wherein said pinch-off region is entirely situated at a depth below said primary cathode-base region in said device.

9. The semiconductor device of claim 5 wherein said junction termination extension region extends from said pinch-off region to said primary cathode-base region.

10. The semiconductor device of claim 5 wherein the upper surface of said second layer in the primary cathode-base region is elevated above the upper surface of the pinch-off region.

11. The semiconductor device of claim 10 wherein said junction termination extension region extends from said pinch-off region to said primary cathode-base region.

12. A semiconductor switching device for switching on a main current developed by an applied voltage supplied to said device only when said voltage is below a predetermined magnitude, comprising:

first, second and third regions of semiconductor material of alternating conductivity types, said second region overlying said first region, said third region overlying a substantial portion of said second region, said second region providing a control current path therein between said third region and the remainder of said second region;

a conductor of predetermined admittance coupled between said second and third regions; and a controlled pinch-off region situated in the current path of said second region and substantially surrounding said remainder of said second region, said pinch-off region exhibiting a charge concentration per unit area selected such that said pinch-off region exhibits high average admittance relative to that of said conductor, said applied voltage supplied to said semiconductor device being between zero and a selected value and said pinch-off region exhibiting a low admittance relative to said conductor when said applied voltage is at least equal to said selected value.

13. The semiconductor switching device of claim 12 including a first conductive layer overlying a portion of said remainder of said second region, and a second conductive layer overlying said third region, said conductor being connected between said first conductive layer and said second conductive layer.

* * * * *